United States Patent
Chen et al.

(10) Patent No.: US 11,437,946 B2
(45) Date of Patent: Sep. 6, 2022

(54) MOTOR OUTPUT STABILIZING CIRCUIT AND METHOD

(71) Applicant: ANPEC ELECTRONICS CORPORATION, Hsinchu (TW)

(72) Inventors: Li-Wei Chen, Hsinchu (TW); Shih-Hai Chien, Hsinchu (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 152 days.

(21) Appl. No.: 17/115,795

(22) Filed: Dec. 9, 2020

(65) Prior Publication Data

US 2022/0085742 A1  Mar. 17, 2022

(30) Foreign Application Priority Data

Sep. 16, 2020 (TW) ................... 109131776

(51) Int. Cl.
*H02P 3/14* (2006.01)
*H03K 5/24* (2006.01)
*H02P 23/14* (2006.01)

(52) U.S. Cl.
CPC ............ *H02P 23/14* (2013.01); *H03K 5/24* (2013.01)

(58) Field of Classification Search
CPC ......... H02P 23/14; H03K 5/1532; H03K 5/24
See application file for complete search history.

(56) References Cited

U.S. PATENT DOCUMENTS

| 8,723,463 | B2* | 5/2014 | Lin | H02P 6/15 |
| | | | | 318/400.14 |
| 2005/0218844 | A1* | 10/2005 | Ichimaru | H02P 6/16 |
| | | | | 318/400.3 |
| 2009/0121790 | A1* | 5/2009 | Brown | H03M 3/456 |
| | | | | 327/60 |
| 2015/0061551 | A1* | 3/2015 | Tsai | H02P 7/29 |
| | | | | 318/400.2 |

FOREIGN PATENT DOCUMENTS

CN 107257214 A 10/2017
TW 201206048 A1 2/2012

* cited by examiner

*Primary Examiner* — Thai T Dinh
(74) *Attorney, Agent, or Firm* — Li & Cai Intellectual Property Office

(57) ABSTRACT

A motor output stabilizing circuit and a method are provided. A sensor senses a positive voltage and a negative voltage that are generated with a change in magnetic field strength of a motor of which a rotor is rotating. A comparator compares the positive voltage with the negative voltage to output a Hall signal. An average counter records a first time during which the positive voltage is higher than the negative voltage and a second time during which the negative voltage is higher than the positive voltage, according to the Hall signal. The average counter then averages the first time and the second time to output an averaged time signal. A motor controller circuit controls a motor driver circuit to drive the motor according to the averaged time signal, such that the motor outputs a constant current.

14 Claims, 7 Drawing Sheets

MOTOR OUTPUT STABILIZING CIRCUIT AND METHOD

CROSS-REFERENCE TO RELATED PATENT APPLICATION

This application claims the benefit of priority to Taiwan Patent Application No. 109131776, filed on Sep. 16, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entirety and to the same extent as if each reference was individually incorporated by reference.

FIELD OF THE DISCLOSURE

The present disclosure relates to a motor, and more particularly to a motor output stabilizing circuit and method.

BACKGROUND OF THE DISCLOSURE

Motors such as DC motors and AC motors are commonly used to convert electrical energy into kinetic energy for driving various tool machines in many industrial applications. The AC motors mainly include AC induction motors and brushless DC motors, in which the brushless DC motors are more widely used. However, slots and poles of most of the motors are not symmetrical to each other, which results in large change in a peak value of an output current of a running motor.

SUMMARY OF THE DISCLOSURE

In response to the above-referenced technical inadequacies, the present disclosure provides a motor output stabilizing circuit for a motor. The motor is connected to a motor driver circuit for driving the motor. The motor output stabilizing circuit includes a sensor, a comparator, an average counter and a motor controller circuit. The sensor is disposed adjacent to the motor. The sensor is configured to sense a positive voltage and a negative voltage that are generated with a change in magnetic field strength of the motor of which a rotor is rotating. The comparator is connected to the sensor and configured to compare the positive voltage with the negative voltage to output a Hall signal. The average counter is connected to the comparator. The average counter is configured to record a first time during which the Hall signal is at a first level. The average counter is configured to record a second time during which the Hall signal is at a second level that is different from the first level. The average counter is configured to average the first time and the second time to obtain an averaged time value, and output an averaged time signal according to the averaged time value. The motor controller circuit is connected to the average counter and the motor driver circuit. The motor controller circuit is configured to control the motor driver circuit to drive the motor according to the averaged time signal, such that peak values of waveforms of a current signal outputted by the motor are equal to each other or approach each other.

In certain embodiments, the average counter calculates the averaged time value of the first time and the second time of a waveform of one cycle of the Hall signal, or calculates the averaged time value of first times and second times of waveforms of a plurality of cycles of the Hall signal. One of the first time and the second time is a working period of the waveform or each of the waveforms, and another one of the first time and the second time is a non-working period of the waveform or each of the waveforms.

In certain embodiments, one of the first time and the second time is a time during which the positive voltage is higher than the negative voltage, and another one of the first time and the second time is a time during which the negative voltage is higher than the positive voltage.

In certain embodiments, when the average counter determines that the first time is not equal to the second time, the average counter calculates the averaged time value of the first time and the second time, and resets the averaged time signal according to the averaged time value.

In certain embodiments, the average counter calculates the averaged time value of the first time and the second time of the waveform of one cycle of the Hall signal, and defines a time point of a positive edge of the averaged time signal as a phase reset time point. When a present time reaches the phase reset time point of the waveform of a next cycle of the averaged time signal, the average counter triggers the waveform of the next cycle of the averaged time signal to be reset such that a time length of a working period of the averaged time signal is equal to the averaged time value and a time length of a non-working period of the averaged time signal is equal to the averaged time value.

In certain embodiments, the average counter defines a time point of a negative edge of the averaged time signal as a phase reset time point. When a present time reaches the phase reset time point of the waveform of a next cycle of the averaged time signal, the average counter triggers the waveform of the next cycle of the averaged time signal to be reset such that a time length of a working period of the averaged time signal is equal to the averaged time value and a time length of a non-working period of the averaged time signal is equal to the averaged time value.

In certain embodiments, the motor driver circuit includes a plurality of switch components, and the motor controller circuit is configured to turn on or off the switch components to control the motor according to the averaged time value.

In addition, the present disclosure provides a motor output stabilizing method for a motor. The motor is driven by a motor driver circuit, and the motor output stabilizing method includes following steps: sensing a positive voltage and a negative voltage that are generated with a change in magnetic field strength of the motor of which a rotor is rotating; comparing the positive voltage and the negative voltage to output a Hall signal; recording a first time during which the Hall signal is at a first level; recording a second time during which the Hall signal is at a second level that is different from the first level; calculating an averaged time value of the first time and the second time to output an averaged time signal; and controlling the motor driver circuit to drive the motor according to the averaged time signal, such that peak values of waveforms of a current signal outputted by the motor are equal to each other or approach each other.

In certain embodiments, the motor output stabilizing method further includes the following steps: calculating the averaged time value of the first time and the second time of a waveform of one cycle of the Hall signal, in which one of the first time and the second time is a working period of the waveform of the one cycle of the Hall signal, and another one of the first time and the second time is a non-working period of the waveform of the one cycle of the Hall signal.

In certain embodiments, the motor output stabilizing method further includes the following steps: calculating an averaged time value of first times and second times of waveforms of a plurality of cycles of the Hall signal, in which one of the first time and the second time is a working period of each of the waveforms of the plurality of cycles of the Hall signal, and another one of the first time and the second time is a non-working period of each of the waveforms of the plurality of cycles of the Hall signal.

In certain embodiments, the motor output stabilizing method further includes the following steps: determining whether or not the first time is equal to the second time, in response to determining that the first time is equal to the second time, averaging the first time and the second time to obtain the averaged time value and resetting the averaged time signal according to the averaged time value, in response to determining that the first time is not equal to the second time, the averaged time value is not calculated.

In certain embodiments, the motor output stabilizing method further includes the following steps: calculating the averaged time value of the first time and the second time of one cycle of the Hall signal; defining a time point of a positive edge of the averaged time signal as a phase reset time point; and triggering a waveform of a next cycle of the averaged time signal to be reset when a present time reaches the phase reset time point of the waveform of the next cycle of the averaged time signal, in which a time length of a working period of the next cycle of the averaged time signal is equal to the averaged time value, and a time length of a non-working period of the next cycle of the averaged time signal is equal to the averaged time value.

In certain embodiments, the motor output stabilizing method further includes the following steps: defining a time point of a negative edge of the averaged time signal as a phase reset time point; and triggering a waveform of a next cycle of the averaged time signal to be reset when a present time reaches the phase reset time point of a waveform of a previous cycle of the averaged time signal, such that a time length of a working period of the next cycle of the averaged time signal is equal to the averaged time value, and a time length of a non-working period of the next cycle of the averaged time signal is equal to the averaged time value.

In certain embodiments, the motor output stabilizing method further includes the following steps: turning on or off a plurality of switch components included in the motor driver circuit to control the motor according to the averaged time value.

As described above, the present disclosure provides the motor output stabilizing circuit and method. When slots and poles of the motor are not symmetrical to each other such that the current peak value of the motor changes greatly, the average counter records the first time during which the positive voltage sensed by the sensor is higher than the negative voltage, and records the second time during which the negative voltage sensed by the sensor is higher than the positive voltage, according to the Hall signal. The average counter then averages the first time and the second time to obtain the averaged time value, and resets the phase of the averaged time signal according to the averaged time value. In this way, the motor driver circuit drives the motor to stably output a constant current according to the averaged time signal of which the phase has been reset, such that power consumption of the motor is constant.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
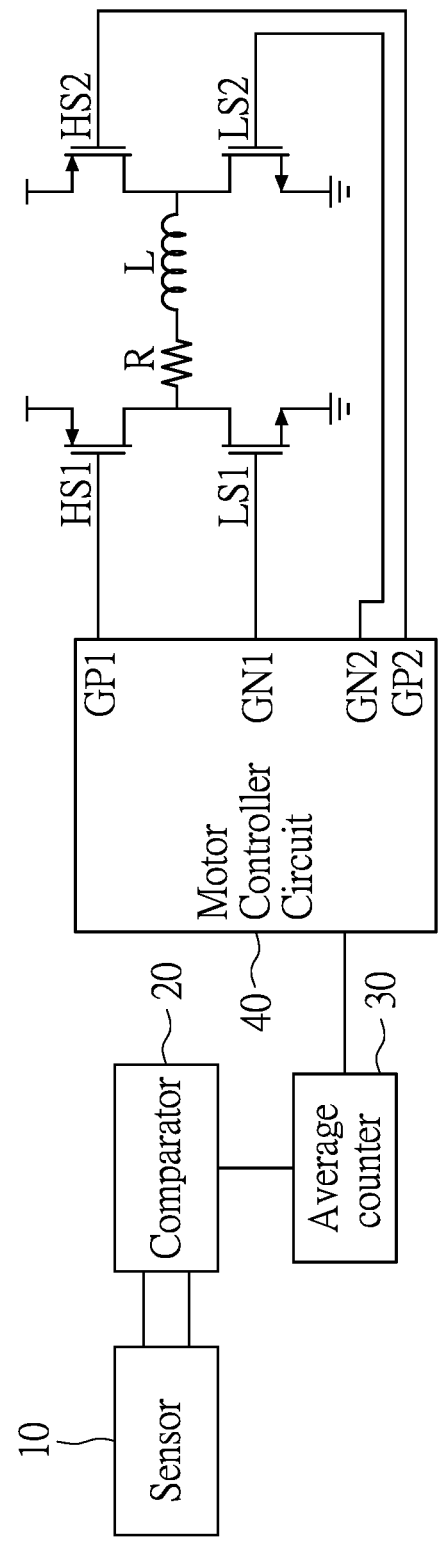
FIG. 1 is a block diagram of a motor output stabilizing circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a motor output stabilizing circuit according to an embodiment of the present disclosure.

As shown in FIG. 1, in the embodiment of the present disclosure, the motor output stabilizing circuit may include a sensor 10, a comparator 20, an average counter 30 and a motor controller circuit 40 that are applicable to a motor.

The sensor 10 may be a Hall sensor and disposed adjacent to the motor. For example, the sensor 10 is disposed between a rotor of the motor and a stator of the motor. The sensor 10 is configured to sense a positive voltage (H+) and a negative voltage (H−) that are generated with a change in magnetic field strength of the motor of which the rotor is rotating.

A first input terminal and a second input terminal of the comparator 20 are connected to an output terminal of the sensor 10. The first input terminal of the comparator 20 receives the positive voltage (H+) from the sensor 10. The second input terminal of the comparator 20 receives the negative voltage (H−) from the sensor 10. The comparator 20 is configured to compare the positive voltage (H+) and the negative voltage (H−) to output a Hall signal.

The average counter 30 may be connected to the comparator 20. The average counter 30 is configured to receive the Hall signal from the comparator 20. The average counter 30 may record a first time during which the Hall signal is at a first level such as a high level, and records a second time during which the Hall signal is at a second level that is different from the first level, such as a low level. In other words, the average counter 30 may determine a relationship between the positive voltage (H+) and the negative voltage (H−) according to the level of the Hall signal. The average counter 30 may record the first time during which the positive voltage (H+) is higher than the negative voltage (H−), and the second time during which the negative voltage (H−) is higher than the positive voltage (H+). It is worth noting that, the average counter 30 averages the first time and the second time to obtain an averaged time value, so as to output an averaged time signal.

The motor controller circuit 40 may be connected to the average counter 30 and a motor driver circuit. The motor driver circuit may include a plurality of switch components connected to the motor. For example, in the present embodiment, the motor is a single-phase motor, and the motor driver circuit is a H-bridge driver circuit including a first upper bridge switch HS1, a first lower bridge switch LS1, a second upper bridge switch HS2 and a second lower bridge switch LS2 (as shown in FIG. 1).

As shown in FIG. 1, a first output terminal GP1 of the motor controller circuit 40 is connected to a control terminal of the first upper bridge switch HS1. A second output terminal GN1 of the motor controller circuit 40 is connected to a control terminal of the first lower bridge switch LS1. A third output terminal GP2 of the motor controller circuit 40 is connected to a control terminal of the second upper bridge switch HS2. A fourth output terminal GN2 of the motor controller circuit 40 is connected to a control terminal of the second lower bridge switch LS2.

A first terminal of the first upper bridge switch HS1 and a first terminal of the second upper bridge switch HS2 may be connected to a common power source (not shown in figures), and receive a common power such a common voltage from the common power source. A second terminal of the first upper bridge switch HS1 and a first terminal of the first lower bridge switch LS1 may be connected to a first terminal of a resistor R of the motor. A second terminal of the resistor R of the motor is connected to a first terminal of an inductor L of the motor. A second terminal of the second upper bridge switch HS2 and a first terminal of the second lower bridge switch LS2 may be connected to a second terminal of the inductor L of the motor. A second terminal of the first lower bridge switch LS1 and a second terminal of the second lower bridge switch LS2 are grounded.

The motor controller circuit 40 may receive the averaged time signal from the average counter 30 and control the motor driver circuit to drive the motor according to the averaged time signal, such that the motor outputs a constant current. That is, current peak values of waveforms of a current signal outputted by the motor are equal to each other or approach each other.

Figure 2:
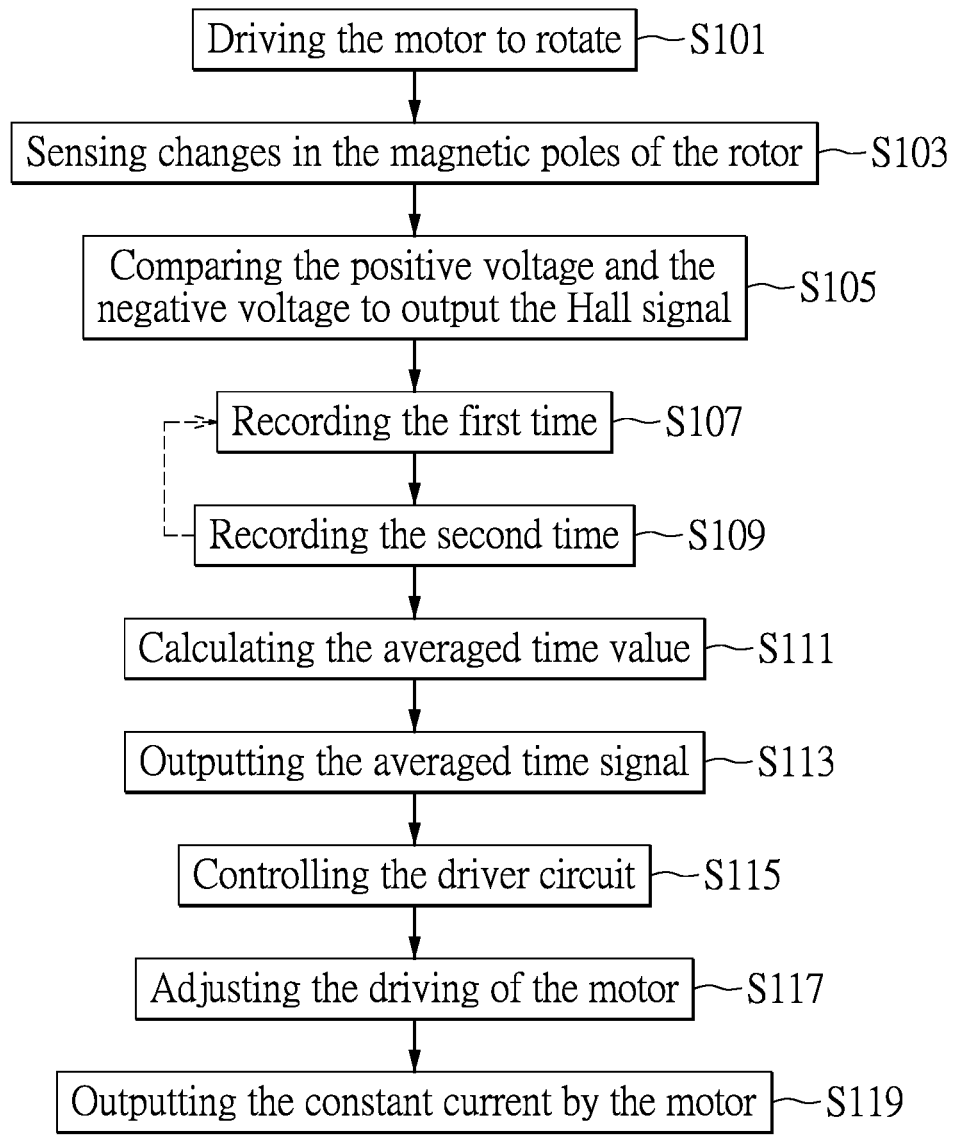
FIG. 2 is a flowchart showing steps of calculating an averaged time value of a motor output stabilizing method according to the embodiment of the present disclosure.
Figure 4:
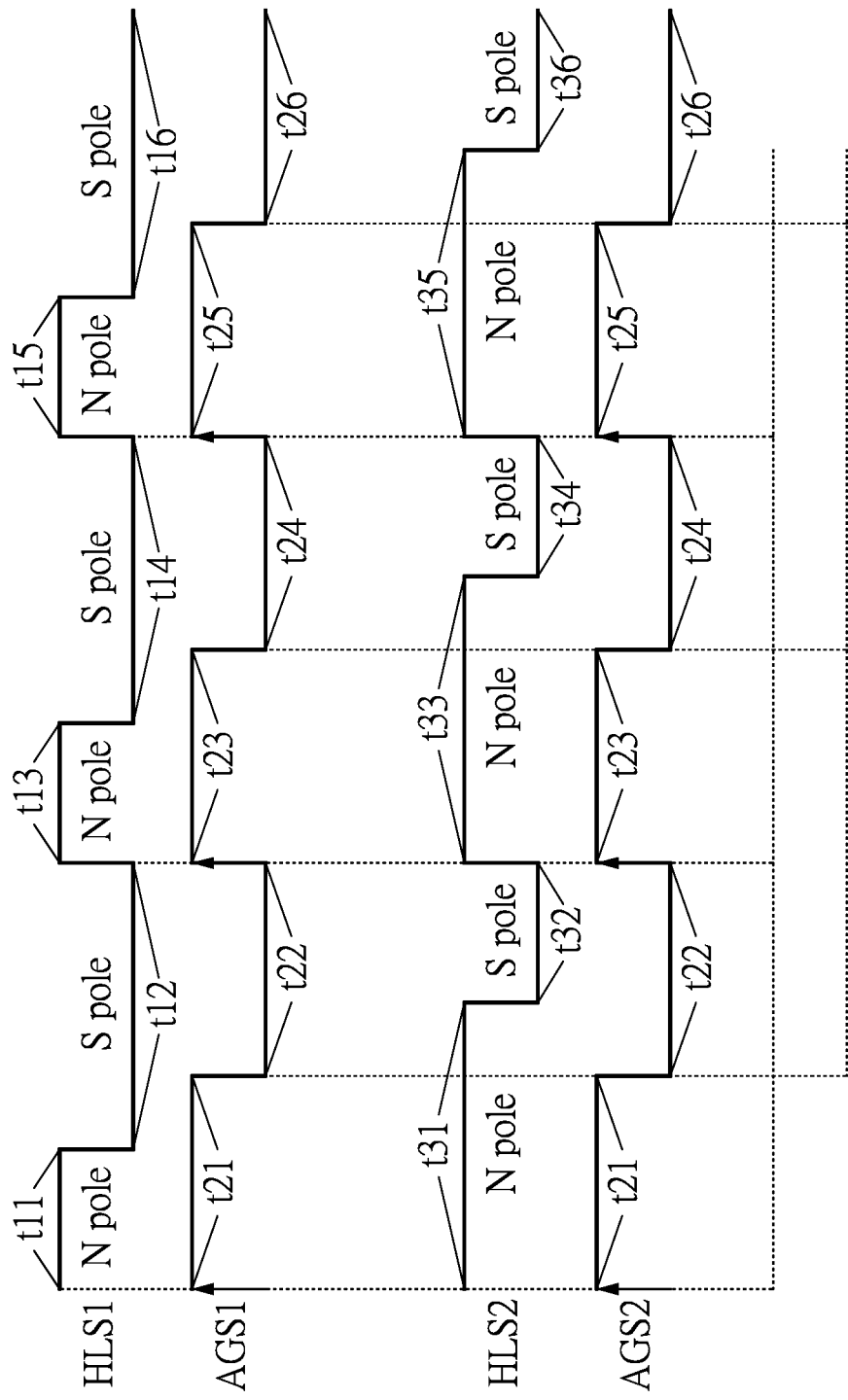
FIG. 4 is a waveform diagram of averaged time signals of which phases are reset when a present time reaches time points of positive edges of the averaged time signals in the motor output stabilizing circuit and method according to the embodiment of the present disclosure.
Figure 5:
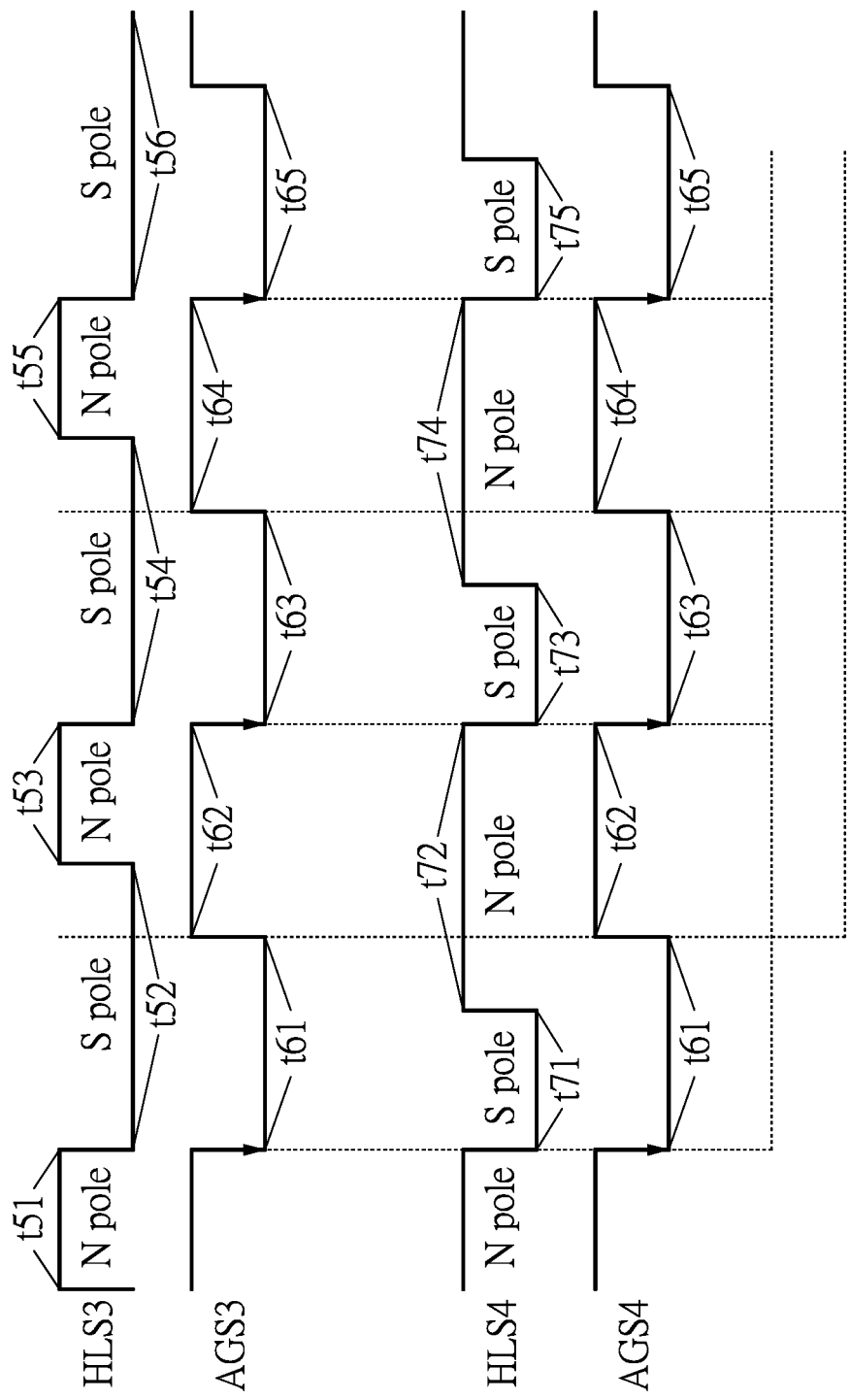
FIG. 5 is a waveform diagram of averaged time signals of which phases are reset when a present time reaches time points of negative edges of the averaged time signals in the motor output stabilizing circuit and method according to the embodiment of the present disclosure.

Reference is made to FIGS. 2, 4 and 5, in which FIG. 2 is a flowchart of a step of calculating an averaged time value of a motor output stabilizing method according to the embodiment of the present disclosure, FIG. 4 is a waveform diagram of averaged time signals of which phases are reset when a present time reaches time points of positive edges of the averaged time signals in the motor output stabilizing circuit and method according to the embodiment of the present disclosure, and FIG. 5 is a waveform diagram of averaged time signals of which phases are reset when a present time reaches time points of negative edges of the averaged time signals in the motor output stabilizing circuit and method according to the embodiment of the present disclosure.

In the embodiment of the present disclosure, the motor output stabilizing method may include steps S101 to S119 shown in FIG. 2. The steps S101 to S119 may be performed by the motor output stabilizing circuit shown in FIG. 1 and are applicable to the motor. It should be understood that, an order of performing the steps S101 to S119, the number of times that each of the steps S101 to S119 is performed, and contents of the steps S101 to S119 may be adjusted according to actual requirements.

In step S101, the motor driver circuit 40 controls the motor driver circuit (such as the first upper bridge switch HS1, the first lower bridge switch LS1, the second upper bridge switch HS2 and the second lower bridge switch LS2 as shown in FIG. 1) to drive the motor to rotate.

In step S103, the sensor 10 senses the positive voltage (H+) and the negative voltage (H−) that are generated with the change in magnetic field strength of the motor of which the rotor is rotating.

In step S105, the comparator 20 compares the positive voltage (H+) with the negative voltage (H−) to generate the Hall signal.

When a value of the positive voltage received by the first input terminal (such as a non-inverting input terminal) of the comparator 20 is higher than a value of the negative voltage received by the second terminal (such as an inverting input terminal) of the comparator 20, the comparator 20 generates the Hall signal at a high level. Conversely, when the value of the negative voltage received by the inverting input terminal of the comparator 20 is higher than the value of the positive voltage received by the non-inverting input terminal of the comparator 20, the comparator 20 generates the Hall signal at a low level.

Alternatively, when the value of the positive voltage received by the inverting input terminal of the comparator 20 is higher than the value of the negative voltage received by the non-inverting input terminal of the comparator 20, the comparator 20 generates the Hall signal at a low level. Conversely, when the value of the negative voltage received by the non-inverting input terminal of the comparator 20 is higher than the value of the positive voltage received by the inverting input terminal of the comparator 20, the comparator 20 generates the Hall signal at a high level.

In step S107, when the Hall signal received by the average counter 30 from the comparator 20 is first at the low level, the average counter 30 records the first time during which the Hall signal is at the low level. However, when the average counter 30 determines that the Hall signal changes from the low level to the high level, step S109 is then performed. In step S109, the average counter 30 starts to record the second time during which the Hall signal is at the high level.

Conversely, when the Hall signal received by the average counter 30 from the comparator 20 is at the high level first, the average counter 30 records the first time during which the Hall signal is at the high level. However, when the average counter 30 determines that the Hall signal changes from the high level to the low level, step S109 is then performed. In step S109, the average counter 30 starts to record the second time during which the Hall signal is at the low level.

In step S111, the average counter 30 calculates the averaged time value of the first time and the second time.

In step S113, the average counter 30 generates the averaged time signal according to the calculated averaged time value.

For example, the comparator 20 outputs a Hall signal HLS1 shown in FIG. 4. The average counter 30 counts and records a first time t11 during which the Hall signal HLS1 is at the high level. The first time t11 is a time length of a working period of a first waveform of the Hall signal HLS1, e.g., a time during which a magnetic pole of the rotor of the motor is an N pole.

Then, as shown in FIG. 4, when the Hall signal HLS1 changes from the high level to the low level, the average counter 30 shown in FIG. 1 times and records a second time t12 during which the Hall signal HLS1 is at the high level. The second time t12 is a time length of a non-working period of the first waveform of the Hall signal HLS1, e.g., a time during which the magnetic pole of the rotor of the motor is an S pole.

When a present time reaches a time point of a positive edge of a waveform of a next cycle of an averaged time signal AGS1 (such as a second waveform of the averaged time signal AGS1), the average counter 30 triggers the waveform of the next cycle of the averaged time signal AGS1 (such as the second waveform of the averaged time signal AGS1) to be generated according to the averaged time value of the first time t11 and the second time t12 of a waveform of a previous cycle of the Hall signal HLS1. The waveform of the next cycle of the averaged time signal AGS1 is aligned with a waveform of a next cycle of the Hall signal HLS1 (such as a second waveform of the Hall signal HLS1).

It is worth noting that, each of a time length of a working period t23 and a time length of a non-working period t24 of the waveform of the next cycle of the averaged time signal AGS1 (such as the second waveform of the averaged time signal AGS1) is equal to the averaged time value of the first time t11 and the second time t12 of the Hall signal HLS1 that is calculated within a time of a waveform of a previous cycle of the averaged time signal AGS1 (such as a first waveform of the averaged time signal AGS1). The time lengths of the working period t23 and the non-working period t24 of the second waveform of the averaged time signal AGS1 are equal to each other.

In the embodiment, the averaged time value of the first time t11 and the second time t12 of the waveform of only one cycle of the Hall signal HLS1 is calculated. That is, a sum of the first time t11 and the second time t12 is divided by 2 to obtain the averaged time value.

However, in practice, steps 107 and 109 shown in FIG. 2 may be performed repeatedly. As a result, the average counter 30 obtains first times and second times of a plurality of cycles of the Hall signal HLS1. For example, the average counter 30 obtains two first times t11 and t13 and two second times t12 and t14 of two cycles of the Hall signal HLS1. Then, the average counter 30 divides a sum of the first times t11 and t13 and the second times t12 and t14 by 4 to obtain the averaged time value. Finally, the average counter 30 resets waveforms of subsequent cycles of the averaged time signal according to the averaged time value.

As shown in FIG. 4, the first time t11 of the Hall signal HLS1 (that is, the time during which the magnetic pole of the rotor of the motor is the N pole) is smaller than the second time t12 of the Hall signal HLS1 (that is, the time during which the magnetic pole of the rotor of the motor is the S pole). Differently, a first time t31 of a Hall signal HLS2 (that is, the time during which the magnetic pole of the rotor of the motor is the N pole) is larger than a second time t32 of the Hall signal HLS2 (that is, the time during which the magnetic pole of the rotor of the motor is the S pole).

As described above, as shown in FIG. 4, a time averaging process of poles is triggered when the present time reaches the time point of the positive edge of the averaged time signal. Differently, as shown in FIG. 5, the time averaging process of poles is triggered when the present time reaches the time point of the negative edge of the averaged time signal, which is more specifically described in the following.

As shown in FIG. 5, when a present time reaches a time point of a negative edge of a waveform of a previous cycle of an averaged time signal AGS3 (such as a waveform having a working period t62), the average counter 30 triggers a waveform of a next cycle of the averaged time signal AGS3 to be reset. Each of a time length of a working period t63 and a time length of a non-working period t64 of the waveform of the next cycle of the averaged time signal AGS3 is equal to an averaged time value of a first time t52 and a second time t53 of the Hall signal HSL3 that is calculated within a time of the waveform of the previous cycle of the averaged time signal AGS3.

As shown in FIG. 5, the first time t52 of the Hall signal HLS3 (that is, the time during which the magnetic pole of the rotor of the motor is the S pole) is larger than the second time t53 of the Hall signal HLS3 (that is, the time during which the magnetic pole of the rotor of the motor is the N pole). Differently, a first time t71 of a Hall signal HLS4 (that is, the time during which the magnetic pole of the rotor of the motor is the S pole) is smaller than a second time t72 of the Hall signal HLS4 (that is, the time during which the magnetic pole of the rotor of the motor is the N pole).

In step S115, the motor controller circuit 40 outputs a motor controlling signal to the motor driver circuit according to the averaged time signal outputted by the average counter 30.

In step S117, according to the motor controlling signal, the motor driver circuit outputs a corresponding motor driving signal for driving the motor to run, such that the motor stably outputs the constant current.

Figure 3:
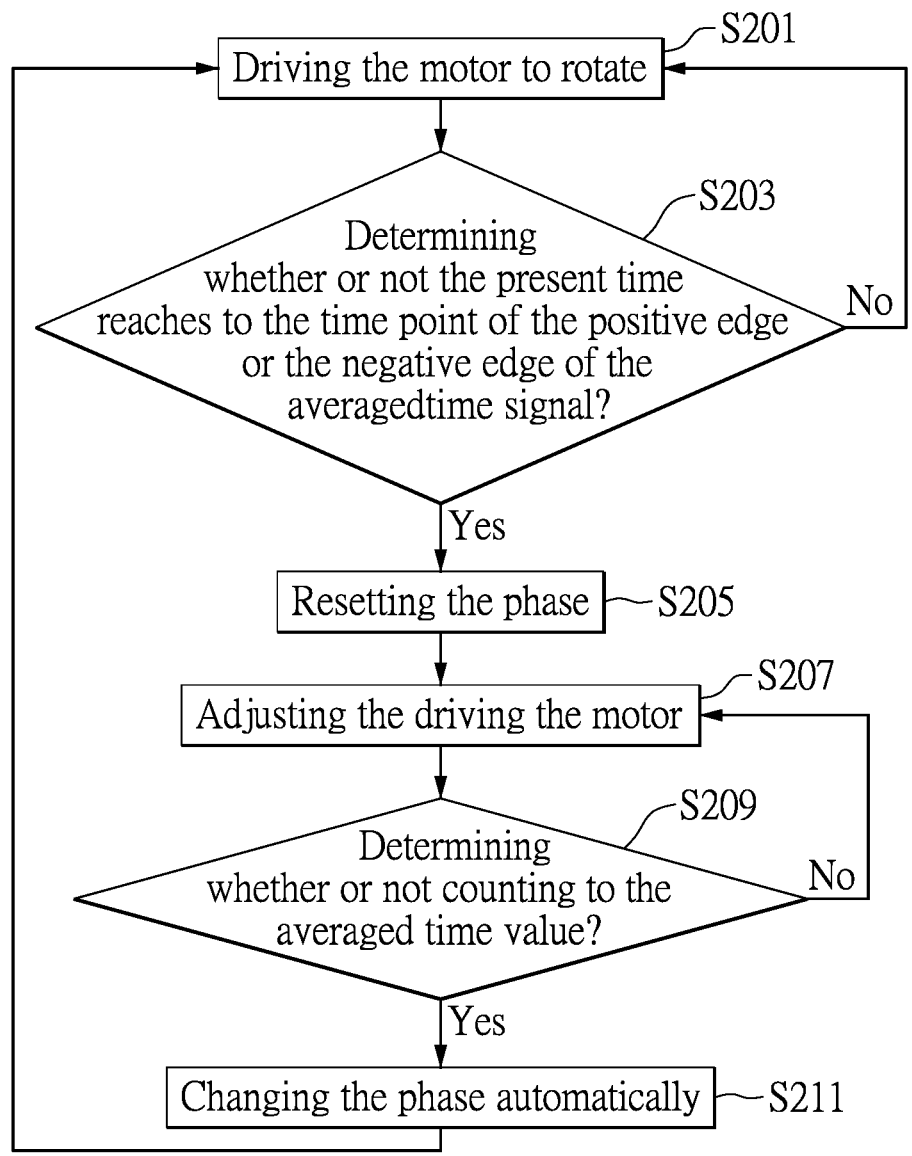
FIG. 3 is a flowchart showing steps of resetting a phase of an averaged time signal in the motor output stabilizing method according to the embodiment of the present disclosure.
Figure 6:
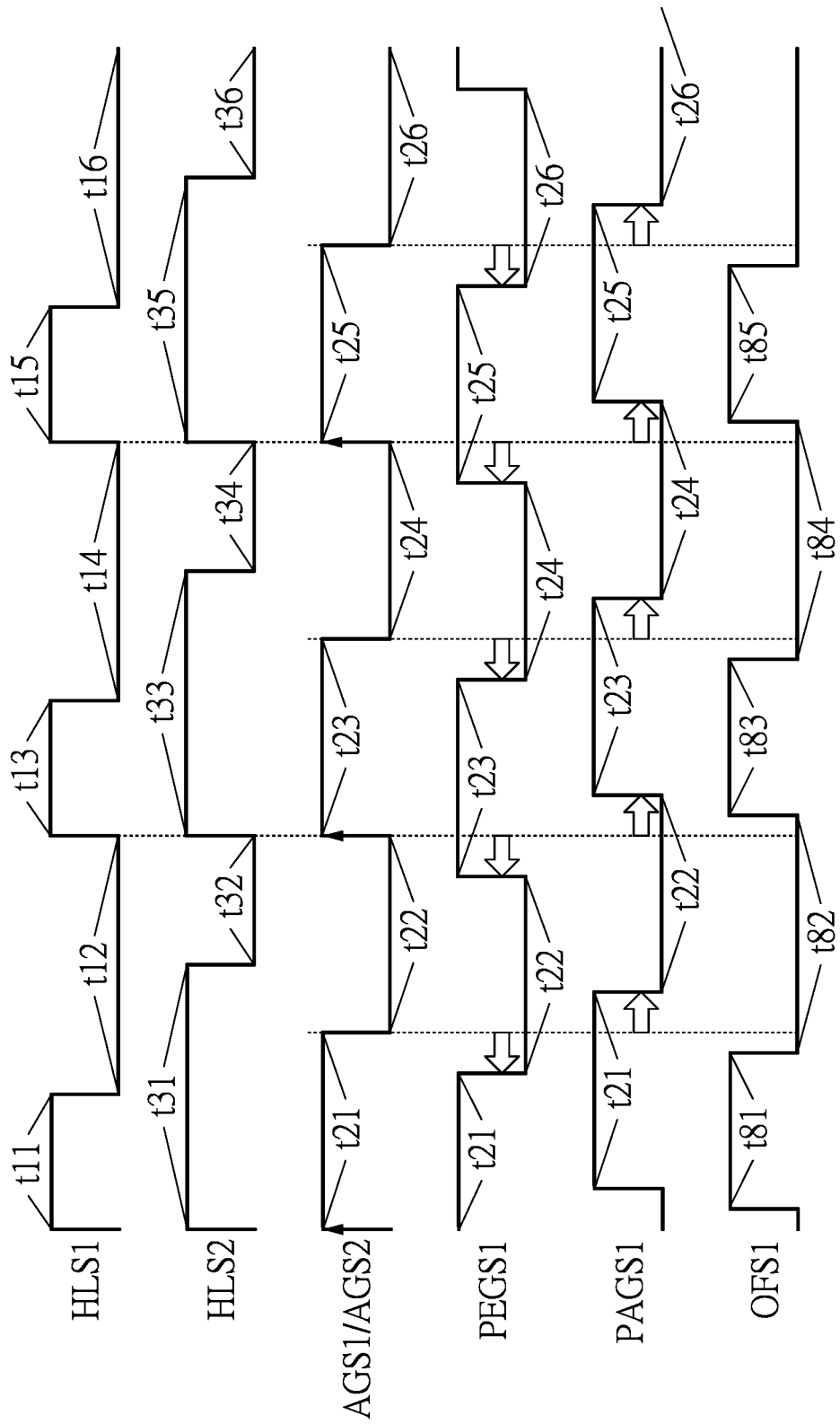
FIG. 6 is a waveform diagram of the averaged time signals of which the phases are reset when the present time reaches the time points of the positive edges of the averaged time signals, and being controlled and adjusted by a motor in the motor output stabilizing circuit and method according to the embodiment of the present disclosure.
Figure 7:
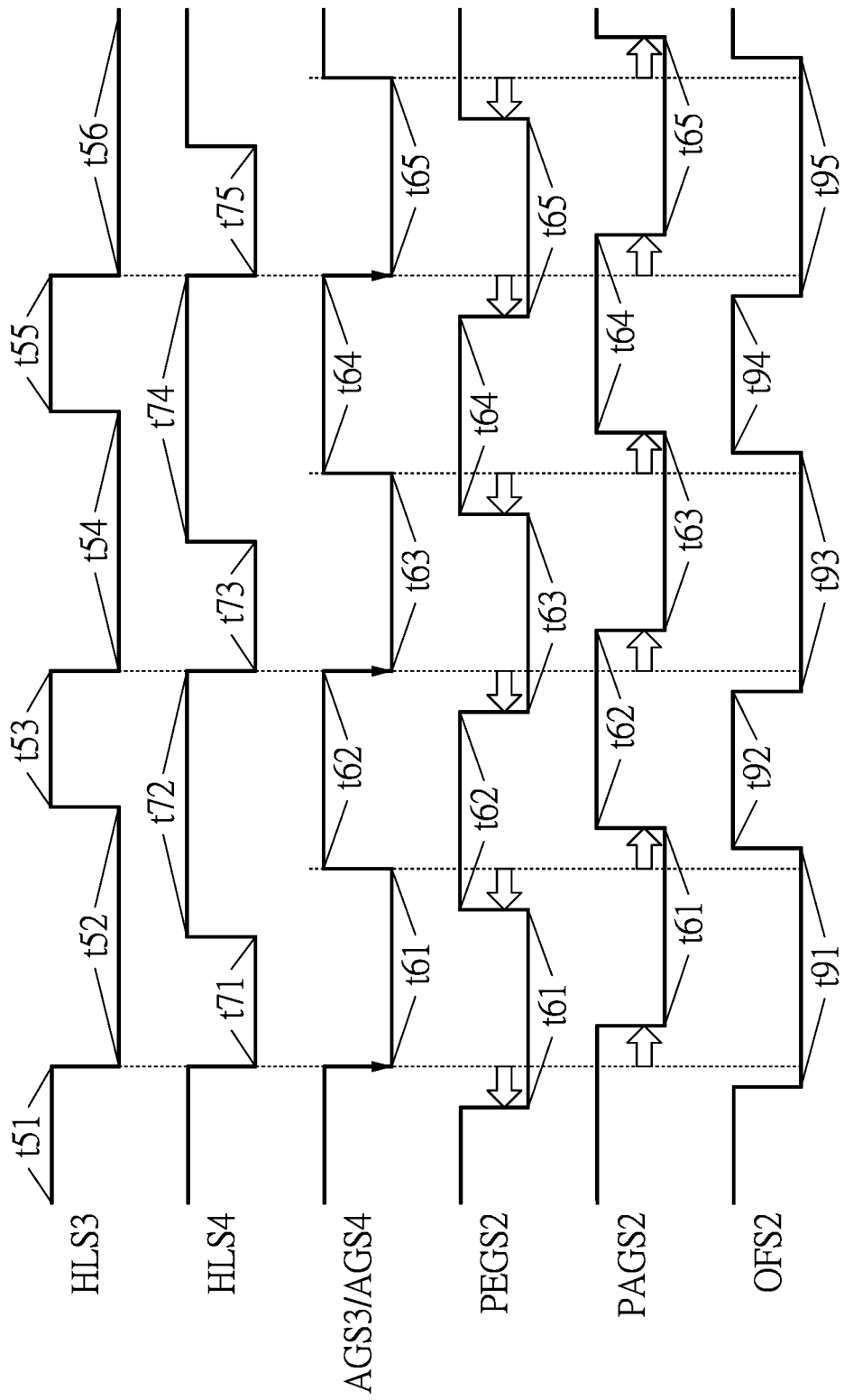
FIG. 7 is a waveform diagram of the averaged time signals of which the phases are reset when the present time reaches the time points of the negative edges of the averaged time signals, and being controlled and adjusted by the motor in the motor output stabilizing circuit and method according to the embodiment of the present disclosure.

Reference is made to FIGS. 1 to 7, in which FIG. 3 is a flowchart of a step of resetting a phase of an averaged time signal in the motor output stabilizing method according to the embodiment of the present disclosure, FIG. 6 is a waveform diagram of the averaged time signals of which the phases are reset when a present time reaches the time points of the positive edges of the averaged time signals in the motor output stabilizing circuit and method according to the embodiment of the present disclosure, and FIG. 7 is a waveform diagram of the averaged time signals of which the phases are reset when the present time reaches the time points of the negative edges of the averaged time signals in the motor output stabilizing circuit and method according to the embodiment of the present disclosure.

In the embodiment of the present disclosure, the motor output stabilizing method may include steps S201 to S211 shown in FIG. 3, which may be appropriately combined with the steps S101 to S119 shown in FIG. 2 and performed by the motor output stabilizing circuit for the motor. It should be understood that, an order of performing the steps S201 to S211, the number of times that each of the steps S201 to S211 is performed, and contents of the steps S201 to S211 may be adjusted according to actual requirements.

In step S201, the motor controller circuit 40 controls the motor driver circuit (that may include the first upper bridge switch HS1, the first lower bridge switch LS1, the second upper bridge switch HS2 and the second lower bridge switch LS2) to drive the motor to rotate.

When the motor is rotating, the sensor 10 senses the positive voltage (H+) and the negative voltage (H−) that are generated with the change in magnetic field strength of the motor of which the rotor is rotating. The comparator 20 compares the values of the positive voltage (H+) and the negative voltage (H−) to input the Hall signal such as the Hall signal HLS1, HSL2, HLS3 or HSL4 as shown in FIGS. 4 to 6.

In step S203, the average counter 30 determines whether or not a present time reaches a reset time point of the averaged time signal, such as the time point of the positive edge or the negative edge of the averaged time signal. If the present time does not reach the reset time point of the averaged time signal, step S201 is performed again. If the present time reaches the reset time point of the averaged time signal, the average counter 30 determines that the phase of the averaged time signal needs to be reset.

In step S205, the average counter 30 records the first time during which a waveform of one cycle of the Hall signal is at the first level such as the high level, and records the second time during which the waveform of the cycle of the Hall signal is at the second level such as the low level. The average counter 30 averages the first time and the second time to obtain the averaged time value. The average counter 30 adjusts the phase of the averaged time signal according to the averaged time value to reset the phase of the averaged time signal.

In step S207, the motor controller circuit outputs the motor controlling signal for controlling the motor driver circuit to drive the motor according to the averaged time signal of which the phase has been reset.

In step S209, the average counter 30 determines whether or not the averaged time value of the waveforms of the subsequent cycles of the Hall signal is being calculated, determines whether or not the first time is not equal to the second time, or determines whether or not the averaged time value calculated subsequently is not equal to the averaged time value calculated previously. If the averaged time value of the waveforms of the subsequent cycles of the Hall signal is not being calculated, the first time is equal to the second time, or the averaged time value subsequent calculated is equal to the averaged time value calculated previously, step S207 is returned to so as to continuously drive the motor. If the averaged time value of the waveforms of the subsequent cycles of the Hall signal is being calculated, the first time is not equal to the second time, or the averaged time value subsequent calculated is not equal to the averaged time value calculated previously, step S211 is then performed.

In step S211, when the present time reaches the reset time point of the subsequent waveform of the averaged time signal, the average counter 30 calculates a new averaged time value of the first time and the second time of a subsequent waveform of the Hall signal to generate a new averaged time signal, and adjusts the phase of the averaged time signal according to the new averaged time signal. Then, step S201 is performed again. In step 201, the motor controller circuit controls the motor driver circuit to drive the motor to rotate according to the adjusted averaged time signal.

For example, as shown in FIG. 6, the average counter 30 adjusts a phase of the averaged time signal AGS1 or AGS2 to generate a phase lead averaged time signal PEGS1 or a phase lag averaged time signal PAGS1, according to the averaged time value of the Hall signal or other parameters of the motor.

For example, as shown in FIG. 7, the average counter 30 adjusts a phase of the averaged time signal AGS3 or AGS4 to generate a phase lead averaged time signal PEGS2 or a phase lag averaged time signal PAGS2, according to the averaged time value of the Hall signal or other parameters of the motor.

In addition, as shown in FIG. 6, the average counter 30 generates a switch controlling signal OFS1 according to the averaged time signal AGS1, AGS2, AGS3 or AGS4, the phase lead averaged time signal PEGS1, PEGS2, or the phase lag averaged time signal PAGS1 or PAGS2. The motor controller circuit 40 turns on or off the switch components of the motor driver circuit to control the motor.

In summary, the present disclosure provides the motor output stabilizing circuit and method. When slots and poles of the motor are not symmetrical to each other such that the current peak value of the motor changes greatly, the average counter records the first time during which the positive voltage sensed by the sensor is higher than the negative voltage, and records the second time during which the negative voltage sensed by the sensor is higher than the positive voltage, according to the Hall signal. The average counter then averages the first time and the second time to obtain the averaged time value, and resets the phase of the averaged time signal according to the averaged time value. In this way, the motor driver circuit drives the motor to stably output the constant current according to the averaged time signal of which the phase has been reset, such that power consumption of the motor is constant.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A motor output stabilizing circuit for a motor, wherein the motor is connected to a motor driver circuit for driving the motor, the motor output stabilizing circuit comprising:
   a sensor disposed adjacent to the motor and configured to sense a positive voltage and a negative voltage that are generated with a change in magnetic field strength of the motor when a rotor of the motor rotates;
   a comparator connected to the sensor and configured to compare the positive voltage with the negative voltage to output a Hall signal;
   an average counter connected to the comparator, and configured to record a first time during which the Hall signal is at a first level, record a second time during which the Hall signal is at a second level that is different from the first level, average the first time and the second time to obtain an averaged time value, and output an averaged time signal according to the averaged time value; and
   a motor controller circuit connected to the average counter and the motor driver circuit, and configured to control the motor driver circuit to drive the motor according to the averaged time signal, such that peak values of waveforms of a current signal outputted by the motor are equal to each other or approach each other.

2. The motor output stabilizing circuit according to claim 1, wherein the average counter calculates the averaged time value of the first time and the second time of a waveform of one cycle of the Hall signal, or calculates the averaged time value of first times and second times of waveforms of a plurality of cycles of the Hall signal, and one of the first time and the second time is a working period of the waveform or each of the waveforms, and another one of the first time and the second time is a non-working period of the waveform or each of the waveforms.

3. The motor output stabilizing circuit according to claim 1, wherein one of the first time and the second time is a time during which the positive voltage is higher than the negative voltage, and another one of the first time and the second time is a time during which the negative voltage is higher than the positive voltage.

4. The motor output stabilizing circuit according to claim 1, wherein, when the average counter determines that the first time is not equal to the second time, the average counter calculates the averaged time value of the first time and the second time, and resets the averaged time signal according to the averaged time value.

5. The motor output stabilizing circuit according to claim 1, wherein the average counter calculates the averaged time value of the first time and the second time of a waveform of one cycle of the Hall signal, defines a time point of a positive edge of the averaged time signal as a phase reset time point, and when a present time reaches the phase reset time point of a waveform of a next cycle of the averaged time signal, the average counter triggers the waveform of the next cycle of the averaged time signal to be reset such that a time length of a working period of the averaged time signal is equal to the averaged time value and a time length of a non-working period of the averaged time signal is equal to the averaged time value.

6. The motor output stabilizing circuit according to claim 1, wherein the average counter defines a time point of a negative edge of the averaged time signal as a phase reset time point, and when a present time reaches the phase reset time point of a waveform of one cycle of the averaged time signal, the average counter triggers a waveform of a next cycle of the averaged time signal to be reset such that a time length of a working period of the averaged time signal is equal to the averaged time value and a time length of a non-working period of the averaged time signal is equal to the averaged time value.

7. The motor output stabilizing circuit according to claim 1, wherein the motor driver circuit includes a plurality of switch components, and the motor controller circuit is configured to turn on or off the switch components to control the motor according to the averaged time value.

8. A motor output stabilizing method for a motor, wherein the motor is driven by a motor driver circuit, the motor output stabilizing method comprising the following steps:
   sensing a positive voltage and a negative voltage that are generated with a change in magnetic field strength of the motor of which a rotor is rotating;
   comparing the positive voltage and the negative voltage to output a Hall signal;
   recording a first time during which the Hall signal is at a first level;
   recording a second time during which the Hall signal is at a second level that is different from the first level;
   calculating an averaged time value of the first time and the second time to output an averaged time signal; and
   controlling the motor driver circuit to drive the motor according to the averaged time signal, such that peak values of waveforms of a current signal outputted by the motor are equal to each other or approach each other.

9. The motor output stabilizing method according to claim 8, further comprising the following step:
   calculating the averaged time value of the first time and the second time of a waveform of one cycle of the Hall signal, wherein one of the first time and the second time is a working period of the waveform of the one cycle of the Hall signal, and another one of the first time and the second time is a non-working period of the waveform of the one cycle of the Hall signal.

10. The motor output stabilizing method according to claim 8, further comprising the following step:
    calculating an averaged time value of first times and second times of waveforms of a plurality of cycles of the Hall signal, wherein one of the first time and the second time is a working period of each of the waveforms of the plurality of cycles of the Hall signal, and another one of the first time and the second time is a non-working period of each of the waveforms of the plurality of cycles of the Hall signal.

11. The motor output stabilizing method according to claim 8, further comprising the following step:
    determining whether or not the first time is equal to the second time; in response to determining that the first time is equal to the second time, averaging the first time and the second time to obtain the averaged time value and resetting the averaged time signal according to the averaged time value, and in response to determining that the first time is not equal to the second time, not calculating the averaged time value.

12. The motor output stabilizing method according to claim 8, further comprising the following steps:
- calculating the averaged time value of the first time and the second time of a waveform of one cycle of the Hall signal;
- defining a time point of a positive edge of the averaged time signal as a phase reset time point; and
- triggering a waveform of a next cycle of the averaged time signal to be reset when a present time reaches the phase reset time point of the waveform of the next cycle of the averaged time signal, wherein a time length of a working period of the next cycle of the averaged time signal is equal to the averaged time value, and a time length of a non-working period of the next cycle of the averaged time signal is equal to the averaged time value.

13. The motor output stabilizing method according to claim 8, further comprising the following steps:
- defining a time point of a negative edge of the averaged time signal as a phase reset time point; and
- triggering a waveform of a next cycle of the averaged time signal to be reset when a present time reaches the phase reset time point of a waveform of a previous cycle of the averaged time signal, such that a time length of a working period of the next cycle of the averaged time signal is equal to the averaged time value, and a time length of a non-working period of the next cycle of the averaged time signal is equal to the averaged time value.

14. The motor output stabilizing method according to claim 8, further comprising the following step:
- turning on or off a plurality of switch components included in the motor driver circuit to control the motor according to the averaged time value.

\* \* \* \* \*